United States Patent

Harada

[11] Patent Number: 5,901,442
[45] Date of Patent: May 11, 1999

[54] METHOD OF MANUFACTURING LOOSENING PREVENTION KINKS ON LEADS OF AN ELECTRIC MEMBER FOR INSERTION INTO A MOUNTING BOARD

[75] Inventor: Yoshio Harada, Kanagawa, Japan

[73] Assignee: Sony Corporation, Tokyo, Japan

[21] Appl. No.: 08/853,801

[22] Filed: May 9, 1997

Related U.S. Application Data

[62] Division of application No. 08/460,031, Jun. 2, 1995.

[30] Foreign Application Priority Data

Jun. 10, 1994 [JP] Japan .............................. P06-152584

[51] Int. Cl.$^6$ ................................................. H01R 43/04
[52] U.S. Cl. .............................. 29/882; 29/838; 29/839; 29/845; 29/862; 72/712; 361/773
[58] Field of Search ............................. 29/837, 838, 839, 29/845, 861–863, 882, 741, 753, 761; 361/760, 773; 72/383, 401, 402, 712; 439/83, 84

[56] References Cited

U.S. PATENT DOCUMENTS

| | | | |
|---|---|---|---|
| 2,994,057 | 7/1961 | Donohue et al. ...................... | 439/83 X |
| 3,203,078 | 8/1965 | Ustin ......................................... | 29/862 |
| 3,230,612 | 1/1966 | Potter et al. ............................. | 29/862 X |
| 3,638,305 | 2/1972 | Bottcher .................................... | 29/882 |
| 3,754,324 | 8/1973 | Krehbiel, Sr. et al. ............... | 29/882 X |
| 4,691,971 | 9/1987 | Hahn ......................................... | 439/84 X |
| 4,704,790 | 11/1987 | Soth ........................................ | 29/838 |
| 4,744,141 | 5/1988 | Musiari ................................. | 29/838 X |
| 5,038,467 | 8/1991 | Murphy .................................... | 29/845 |

FOREIGN PATENT DOCUMENTS

| | | | |
|---|---|---|---|
| 2812767 | 9/1979 | Germany ............................... | 361/760 |
| 966149 | 8/1964 | United Kingdom ..................... | 29/838 |

OTHER PUBLICATIONS

IBM Technical Disclosure Bulletin vol. 26, No. 5, Oct. 1983, pp. 2656–2657.

*Primary Examiner*—Peter Vo
*Attorney, Agent, or Firm*—Jay H. Maioli

[57] ABSTRACT

A method of manufacturing an electric member having a number of leads such as in a remote-controlled light receiving module, loosening prevention kinks created on at least one of the leads are shaped such that, the shorter the distance from the loosening prevention kink to the tip of the lead the thinner the loosening prevention kink. When the electric member is mounted on a printed circuit board, the leads are inserted into wiring through-holes on the printed circuit board by pressing the electric member against the board, allowing the position and orientation of the electric member to be firmly fixed automatically by virtue of the loosening prevention kinks.

3 Claims, 6 Drawing Sheets

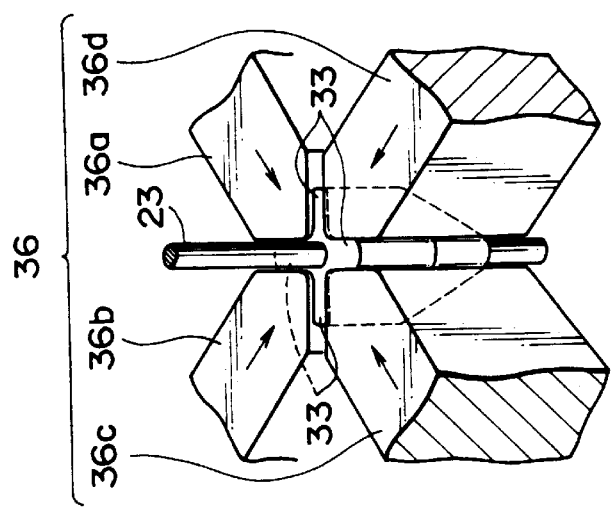
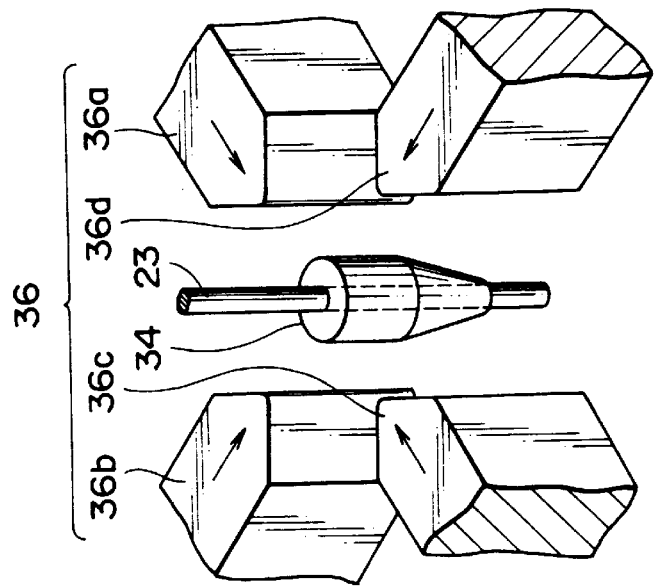
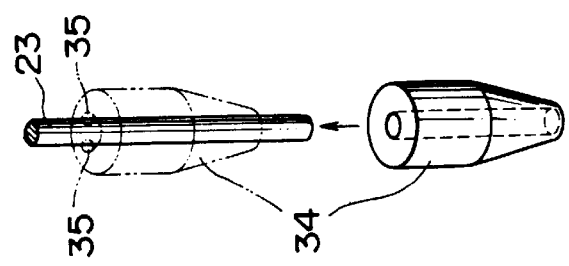

METHOD OF MANUFACTURING LOOSENING PREVENTION KINKS ON LEADS OF AN ELECTRIC MEMBER FOR INSERTION INTO A MOUNTING BOARD

This is a division of application Ser. No. 08/460,031 filed Jun. 2, 1995.

BACKGROUND OF THE INVENTION

1. Field of the Invention

The present invention relates to an electric member having a plurality of leads and a method of manufacturing the electric member.

2. Description of Related Art

A typical remote-controlled light receiving module 4 for receiving infrared light conveying a remote control signal from a remote commander is shown in FIGS. 1A and 1B.

Reference numeral 1 shown in the figures is a package having an approximately cubic shape. The package 1 is made of resin which can be penetrated by the infrared light. A remote-controlled receiver IC which is not shown in the figure is sealed inside the package 1. Reference numeral 2 is a lens having a convex spherical surface created as an integrated part of the front surface of the package 1. The lens 2 is fixed at a location which is optimum for focusing the infrared light modulated by the remote control signal at the remote commander on the light receiving surface of the remote-controlled receiver IC.

Reference numeral 3 denotes a lead protruding from the bottom surface of the package 1 in a direction perpendicular to the bottom surface. In the conventional remote-controlled light receiving module 4, the shapes and the sizes of the sectional surfaces of the leads 3 are uniform at least at the bottom surface of the package 1 from which the leads 3 protrude. The leads 3 are created so as to extend straight out from the bottom surface of the package 1.

Such a remote-controlled light receiving module 4 is used in remote-controlled equipment such as a television receiver, tape recorder and air conditioner. Speaking in concrete terms, it is necessary to insert the external tips of the leads 3 of the remote-controlled light receiving module 4 into predetermined lead inserting through holes on a printed wiring board and solder the leads to wires on the board.

FIG. 2 shows how the conventional remote-controlled light receiving module 4 is typically mounted on a printed wiring board. Reference numeral 5 shown in the figure is the printed wiring board whereas reference numerals 6 each denote a lead inserting through hole created on the printed wiring board 5 for inserting a lead 3. Reference numeral 7 denotes a piece of solder for connecting a lead 3 inserted into a lead inserting through hole 5 to wiring on the printed wiring board 5.

Reference numeral 8 is a socket for enclosing the remote-controlled light receiving module 4. The socket 8 serves as a component for fixing the position of the remote-controlled light receiving module 4, in particular, the height of the remote-controlled light receiving module 4 above the surface of the printed wiring board 5. In addition, the socket 8 is also used for fixing the orientation of the remote-controlled light receiving module 4, in particular, the direction of the optical axis thereof. That is to say, since the remote-controlled light receiving module 4 exhibits a directivity characteristic, the position and the optical axis thereof are very important factors which affect the way the infrared light is received from a remote commander modulated by a remote control signal of an optical apparatus. It is thus necessary to install the remote-controlled light receiving module 4 on the printed wiring board 5 in a way determined in advance.

As described earlier, in the case of the conventional remote-controlled light receiving module 4 shown in FIG. 1, the shapes and the sizes of the sectional surfaces of the leads 3 are uniform at least at the bottom surface of the package 1 from which the leads 3 protrude. The leads 3 are created so as to stretch straight out off the bottom surface of the package 1. Therefore, even with the leads 3 inserted into the lead inserting through holes 6, the conventional remote-controlled light receiving module 4 is still shaky to a certain degree due to a gap existing between the conventional remote-controlled light receiving module 4 and the printed wiring board 5. As a result, the position and orientation of the conventional remote-controlled light receiving module 4 relative to the printed wiring board 5 are not truly fixed. For this reason, loosening and a positional shift are generated inevitably in the conventional remote-controlled light receiving module 4. Loosening refers to an inclination or slope of the optical axis relative to a set direction. Such a slope is undesirable in an optical system. It is needless to say that the positional shift is also undesirable as well. In order to avoid such loosening and such a positional shift, the socket 8 is used for firming the position and the orientation of the remote-controlled light receiving module 4.

The socket 8 has an installation pin 9 to be inserted into a lead inserting through hole 6. Reference numeral 10 is a hook nail 10 formed at the end of the installation pin 9 for hooking the installation pin 9 at the back surface (or the surface on the side not facing the socket body) of the printed wiring board 5. Reference numeral 11 is a stopper created on the installation pin 9 at a position separated from the hook nail 10 at the end of the installation pin 9 by a distance about equal to the thickness of the lead inserting through hole 6. The stopper 11 is used for hooking the installation pin 9 on the front surface (or the surface on the side facing the socket body) of the printed wiring board 5. By hooking the installation pin 9 on the printed wiring board 5 by means of the stopper 11 and the hooking nail 10, the position, particularly the height above the printed wiring board 5, and the orientation of the socket 8 itself are fixed. The socket 8, in turn, firmly sustains the position and orientation of the remote-controlled light receiving module 4. That is to say, the position and orientation of the remote-controlled light receiving module 4 relative to the printed wiring board 5 are fixed in a prescribed manner using the socket 8. At this position and in this orientation, the leads 3 of the remote-controlled light receiving module 4 are soldered to wiring on the printed wiring board 5.

The problems described below are encountered because the position and orientation of the conventional remote-controlled light receiving module 4 shown in FIGS. 1A and 1B are fixed by using the socket 8.

First of all, there is a problem that the cost is increased by the use of the socket 8.

To be more specific, efforts need to be made to reduce the number of components and the number of assembly operations in response to a very strong demand for low-cost remote-controlled equipment such as a television set. In spite of such a demand, the conventional remote-controlled light receiving module 4 employs the socket 8 merely for firming the position thereof. The use of the socket 8 cannot thus be tolerated.

A second problem is that, since the position of the remote-controlled light receiving module 4 is fixed by the socket 8 through dip soldering, the leads 3 are pulled by the tensile stress of the solder 7 during dip soldering, giving rise to a problem that stress is applied to an IC pellet die-bonded to one of the leads 3. It should be noted that the IC pellet itself which is embedded inside the package 1 is not shown in the figure. This problem is described in more detail as follows.

With the position of the conventional remote-controlled light receiving module 4 fixed by the socket 8, the leads 3 are soldered by using a dip-soldering technique. As the solder 7 becomes cool, it shrinks. The shrinking force pulls the leads 3 in a direction indicated by an arrow a shown in FIG. 2.

Since the position of the package 1 is fixed by the socket 8, however, the leads 3 cannot move in the direction indicated by the arrow a. As a result, the leads 3 are inevitably pulled out away from the package 1 downward to the lower side shown in FIG. 2. The IC pellet die-bonded to one of the leads 3, in turn, experiences stress developed by the package 1 for sealing the IC pellet. The application of stress to the IC pellet gives rise to characteristic deterioration, reliability deterioration and an increased failure rate of the IC which are of course undesirable.

SUMMARY OF THE INVENTION

It is a first object of the present invention to eliminate the socket as a means for installing an optical device.

It is a second object of the present invention to provide a new structure having a plurality of leads capable of fixing the position and orientation of an optical component and a method of manufacturing the structure.

The present invention provides an electric member having a plurality of leads to be inserted into lead inserting through holes on a mounting board for mounting the electric member, wherein the electric member is characterized in that, on each of the leads, loosening prevention kinks are created so that the orientation of the leads themselves relative to the mounting board is fixed when the leads are inserted into the lead inserting through holes by applying pressure, wherein the closer the distance from the loosening prevention kinks to the tip of the lead, the thinner the loosening prevention kinks.

The present invention also provides a method for manufacturing the electric member which method is characterized in that each of the leads is enclosed in a sleeve for creating the loosening prevention kinks and, with the lead enclosed in the sleeve for creating the loosening prevention kinks, the loosening prevention kinks are created by caulking the sleeve onto the lead.

The present invention further provides a method for manufacturing the electric member which method is characterized in that each of the leads and the loosening prevention kinks are created at the same time by manufacturing a planar lead material.

In the case of the electric member provided by the present invention, on each of the leads thereof, loosening prevention kinks are created, and the closer the distance from the loosening prevention kinks to the tip of the lead, the thinner the loosening prevention kinks so that the orientation of the leads themselves relative to the mounting board is fixed when the leads are inserted into the lead inserting through holes on the mounting board by applying pressure thereby. With such an electric member, the tips of the leads are first inserted into the lead inserting through holes on the mounting board and then the loosening prevention kinks are inserted into the lead inserting through holes by pressure, allowing the orientation of the leads relative to the mounting board to be fixed firmly. In this way, loosening of the leads can be prevented.

In addition, the position at which the loosening prevention kinks is located on each of the leads determines the height of the electric member itself above the mounting board. As a result, the position of the electric member is also naturally fixed thereby.

Accordingly, the position and the orientation of the electric member can be fixed without using a socket.

In this way, the problems of fixing the position and orientation of the conventional remote-controlled light receiving module, for example, caused by the use of a socket can therefore be solved.

As described above, the present invention also provides a method for manufacturing the electric member wherein each of the leads thereof is enclosed in a sleeve for creating the loosening prevention kinks prepared in advance and, with the lead enclosed in the sleeve for creating the loosening prevention kinks, the loosening prevention kinks can thus be created by merely caulking the sleeve and, at the same time, attaching the sleeve to the lead, allowing the loosening prevention kinks to be formed on the lead very easily.

As a result, an electric member equipped with a plurality of leads each having loosening prevention kinks can be produced without excessively increasing the manufacturing cost, wherein the loosening prevention kinks allow the position of the electric member to be fixed with ease, preventing loosening of the leads from occuring when the electric member is mounted on a printed wiring board.

As described above, the present invention further provides a method for manufacturing the electric member wherein each of the leads thereof and the loosening prevention kinks are created at the same time by manufacturing a planar lead material, requiring no special process used only for creating the loosening prevention kinks. As a result, each of the leads along with the loosening prevention kinks thereof can be created very easily without the necessity of increasing the number of processes.

BRIEF DESCRIPTION OF THE DRAWINGS

FIGS. 5A to 5C are perspective views showing a second embodiment implementing a manufacturing method provided by the present invention, indicating the operation sequence of a technique of creating the loosening prevention kinks, a principal element of the remote-controlled light receiving module shown in FIGS. 3A to 3D, on a lead thereof;

FIGS. 7A to 7C are perspective views showing a fourth embodiment implementing a manufacturing method in accordance with the present invention, indicating the operation sequence for creating the loosening prevention kinks, a principal element of the remote-controlled light receiving module shown in FIG. 6, on a lead thereof;

FIG. 8A shows a perspective view of loosening prevention kinks. FIG. 8B is a sectional view of loosening prevention kinks mounting the remote-controlled light receiving module on a printed wiring board. FIG. 8C shows a bottom view of the state after the mounting of the remote-controlled light receiving module on a printed wiring board.

DETAILED DESCRIPTION OF THE PREFERRED EMBODIMENTS

The present invention will become apparent from the following detailed description of preferred embodiments with reference to the accompanying diagrams described above.

Figure 3A:
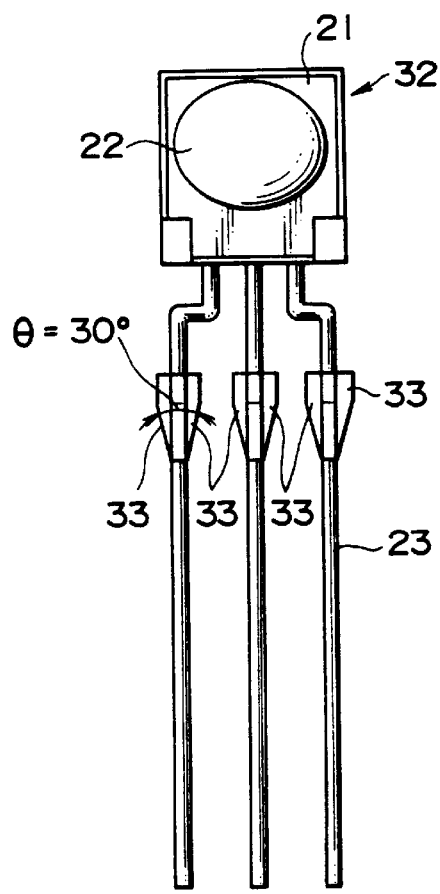
FIGS. 3A, 3B and 3C are diagrams of a first embodiment implementing a remote-controlled light receiving module, showing the front, top and side views thereof
Figure 3C:
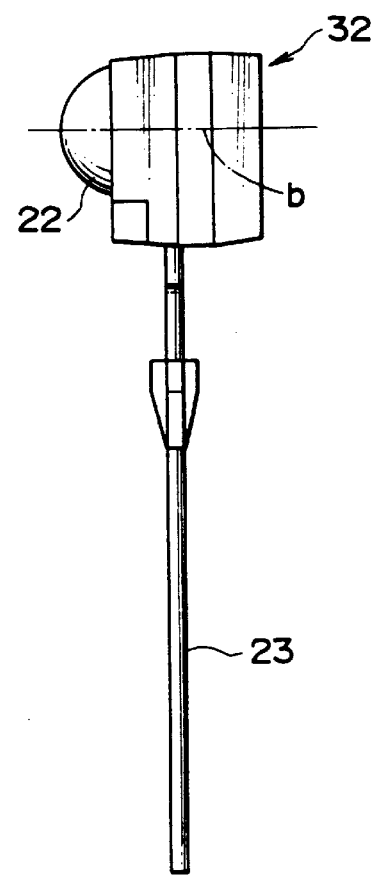
Figure 3B:
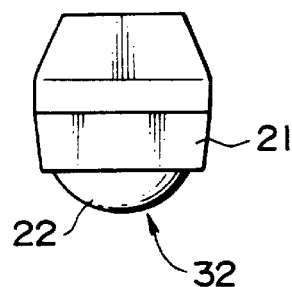
Figure 3D:
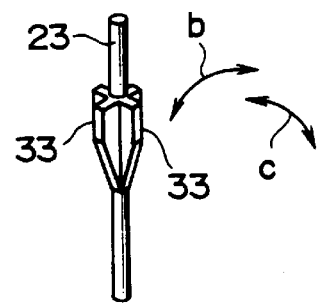
FIG. 3D shows the front view of loosening prevention kinks.

FIGS. 3A to 3D are diagrams of a first embodiment implementing a remote-controlled light receiving module. FIGS. 3A to 3C show the front, top and side views thereof. FIG. 3D shows the front view of loosening prevention kinks.

Figure 1A:
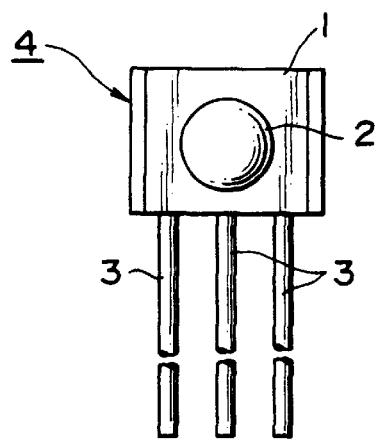
FIGS. 1A to 1B are diagrams of the conventional remote-controlled light receiving module, showing the front and bottom views respectively.
Figure 1B:
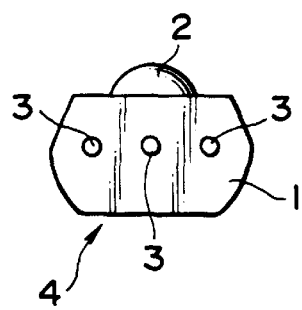

The present remote-controlled light receiving module is different from the conventional one shown in FIGS. 1A and 1B in that each lead of the present invention has loosening prevention kinks. Otherwise, they are basically identical with each other. Since elements common to both the former and latter have been explained, their description is not repeated here. Only their differences are described below. In addition, the elements common to both the former and latter are denoted by the same reference numerals in all the figures.

Reference numeral 32 denotes the present remote-controlled light receiving module. A plurality of leads 23 each have loosening prevention kinks 33 resembling an arrow head. The loosening prevention kinks 33 are four protrusions on the circumference of a center thereof. That is to say, the cross section of the loosening prevention kinks 33 resemble a cross. The remote-controlled light receiving module 32 is mounted on a printed wiring board 25 shown in FIG. 4 by pressing the loosening prevention kinks 33 against the printed wiring board 25 to insert the loosening prevention kinks 33 into lead inserting through holes 26 on the printed wiring board 25. The loosening prevention kinks 33 are formed on one of the leads 23, so that, the shorter the distance from the loosening prevention kinks 33 to the tip of the lead 23, the thinner the loosening prevention kinks 33. With such loosening prevention kinks 33, the orientation of the leads 23 themselves is fixed to be perpendicular to the printed wiring board 25 when the loosening prevention kinks 33 are inserted into the lead inserting through holes 26. Typically, an angle θ is 30 degrees as shown in FIG. 3A. It is needless to say, however, that the angle θ does not have to be 30 degrees in magnitude. That is to say, it can be an angle having a magnitude different from 30 degrees.

The loosening prevention kinks 33 are formed on the leads 23 at predetermined locations such that a package 21 in the remote-controlled light receiving module 32 is positioned at a desirable altitude above the printed wiring board 25.

Figure 4:
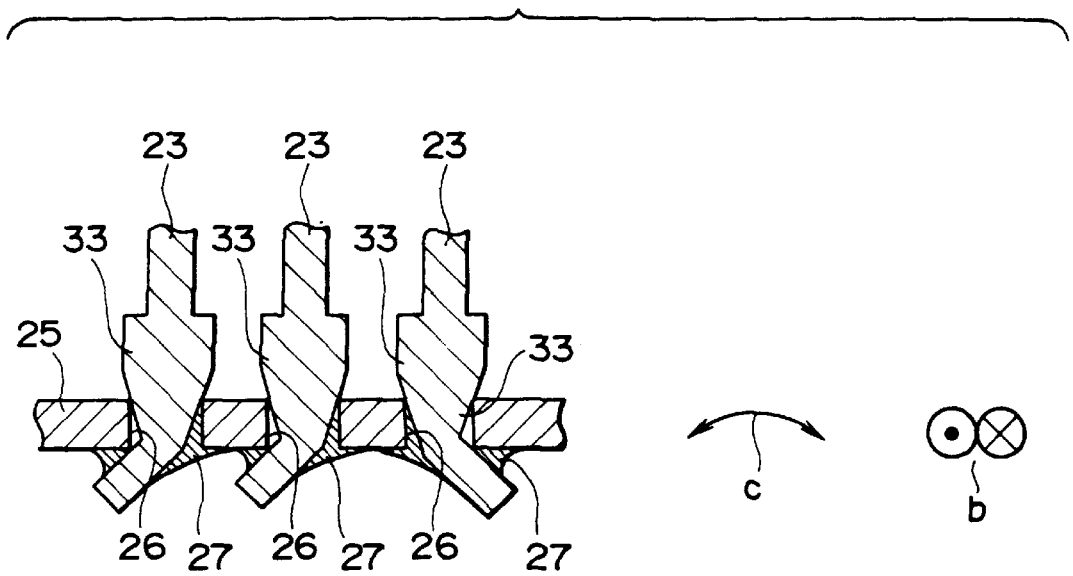
FIG. 4 is a sectional view showing how the remote-controlled light receiving module shown in FIGS. 3A to 3D is typically mounted on a printed wiring board.

FIG. 4 is a sectional view showing how the remote-controlled light receiving module 32 in FIG. 3 is typically mounted on the printed wiring board 25.

In order to mount the remote-controlled light receiving module 32 on the printed wiring board 25, each of the leads 23 is inserted into its corresponding lead inserting through hole 26 on the printed wiring board 25. As the loosening prevention kinks 33 enter the lead inserting through hole 26, the leads 23 are pressed by force against the printed wiring board 25 so that the loosening prevention kinks 33 are inserted into the lead inserting through holes 26 by force of the pressure. In this way, the insertion of the loosening prevention kinks 33 into the lead inserting through holes 26 firmly fixes the positions of the leads 23 relative to the lead inserting through holes 26 in a direction perpendicular to the printed wiring board 25.

As a result, the orientation and the position of the package 21 from which the leads 23 protruding out are also fixed as well. Speaking in concrete terms, there is no loosening in any direction such as a direction indicated by an arrow b, which is, the optically axis direction, and a direction indicated by an arrow c, which is, a direction perpendicular to the optically axis direction, shown in FIGS. 3D and 4.

With the orientation and the position of the package 21 fixed, portions of the leads 23 protruding downward out off the printed wiring board 25 as shown in FIG. 4 are cut to a proper length and bent at the back surface of the printed wiring board 25. The work to insert, cut off and bend the leads 23 can be typically carried out by an insertion machine automatically.

Afterwards, the leads 23 are soldered to wiring on the back surface of the printed wiring board 25 by using the dip soldering technique. Reference numeral 27 is a piece of solder.

Figure 2:
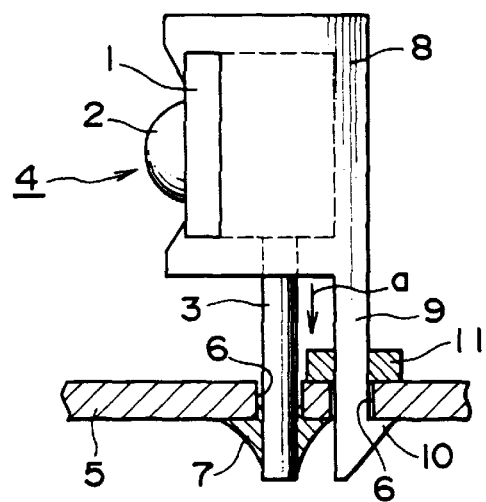
FIG. 2 is a diagram used for explaining how the conventional remote-controlled light receiving module shown in FIGS. 1A and 1B is typically mounted.

It should be noted that in the soldering process, the solder 27 which was once molten shrinks as the solder temperature goes down, generating a shrinking force that pulls the leads 23 in a downward direction as shown in FIG. 2 and as described earlier. However, the loosening prevention kinks 33 deeply seated into the lead inserting through holes 26 function as stoppers so that the shrinking force pulling down the lead 23 is not exerted on the portion of the lead 23 above the loosening prevention kinks 33. As a result, there is no longer a problem in which an IC pellet enclosed in the package 21 experiences such a shrinkage force as is the case with the conventional remote-controlled light receiving module. It should be noted that the IC pellet itself is not shown in the figures.

As described above, the remote-controlled light receiving module 32 is mounted on the printed wiring board 25 by pressing the loosening prevention kinks 33 against the printed wiring board 25 to insert the loosening prevention kinks 33 into the lead inserting through holes 26 on the printed wiring board 25, wherein the loosening prevention kinks 33 are each formed on each lead 23, such that, the shorter the distance from the loosening prevention kinks 33 to the tip of the lead 23, the thinner the loosening prevention kinks 33, allowing the orientation of the leads 23 relative to the printed wiring board 25 to be firmly fixed at the time the leads 23 are inserted into the lead inserting through holes 26. Thus, by inserting the tips of the leads 23 into the lead inserting through holes 26 and further pressing the loosening prevention kinks 33 against the lead inserting through holes 26, the orientation of the leads 23 can be firmly fixed to prevent loosening.

The location on the leads 23 at which the loosening prevention kinks 33 are created determines the height of the remote-controlled light receiving module 32 above the printed wiring board 25. As a result, the position of the remote-controlled light receiving module 32 itself is also naturally fixed thereby. Accordingly, the position and the orientation of the remote-controlled module 32 can be fixed without using a socket.

A second embodiment provided by the present invention is explained next.

As described above, the remote-controlled light receiving module 32 shown in FIGS. 3A to 3D is characterized in that loosening prevention kinks 33 are created on each of the leads 23 thereof. It is thus necessary to create loosening prevention kinks on each of the leads 23 of an electric member of the remote-controlled light receiving module 32. FIGS. 5A to 5C are perspective views showing the operation sequence of a method for creating loosening prevention kinks on a lead 23, an important component of the electric member of the remote-controlled light receiving module 32.

First of all, a lead frame comprising a plurality of leads 23 for the remote-controlled light receiving module 32, which leads 23 are created as a bunch thereon, is prepared. As shown in FIG. 5A, a lead 23 from the lead frame on which loosening prevention kinks 33 are to be created is enclosed by a sleeve 34 for creating the loosening prevention kinks 33 at a location where the loosening prevention kinks 33 are to be positioned. In other words, the lead 23 is inserted into the sleeve 34 for creating the loosening prevention kinks 33. It should be noted that the number of leads 23 in a lead frame on which loosening prevention kinks are to be created varies, depending upon the application. In some cases, loosening prevention kinks 33 are to be created only on some leads 33 of a lead frame, while in other cases, all the leads 23 each need loosening prevention kinks 33.

In FIG. 5A, the sleeve 34 for creating loosening prevention kinks 33 indicated by solid lines is in a state prior to the enclosure of the lead 23 whereas the sleeve 34 for creating loosening prevention kinks 33 indicated by dashed lines is in a state after the enclosure of the lead 23.

Typically, the lead frame is equipped with two stoppers 35 caulked on each lead 23 thereof as indicated by dotted circles in FIG. 5A. The lead 23 is enclosed in the sleeve 34 for creating a loosening prevention kinks 33 by shifting the sleeve 34 up to a location at which the stoppers 35 are attached to the lead 23. In this way, the sleeve 34 can be positioned correctly.

Next, a caulking tool 36 is positioned around the sleeve 34 for creating loosening prevention kinks 33 as shown in FIG. 5B, which sleeve 34 has already enclosed the lead 23. The caulking tool 36 comprises four caulking units 36a, 36b, 36c and 36d separated from each other by an angle of 90 degrees as seen from the center of the caulking tool 36. The caulking units 36a, 36b, 36c and 36d can move centrifugally away from the center or centripetally toward the center simultaneously in synchronization with each other. The edges of the caulking units 36a, 36b, 36c and 36d each have the same shape as the space between two adjacent loosening prevention kinks 33 to be created in the caulking operation.

Next, the caulking tool 36 is actuated to carry out a caulking operation as shown in FIG. 5C. To be more specific, the caulking units 36a, 36b, 36c and 36d are driven to move centripetally, caulking the sleeve 34 for creating loosening prevention kinks 33. In this way, the loosening prevention kinks 33 are created and, at the same time, fixed on the lead 23.

Later on, the caulking tool 36 is operated to move centrifugally, releasing the lead 23.

According to the above method of creating loosening prevention kinks 33, a sleeve 34 for creating the loosening prevention kinks 33 prepared in advance is merely positioned to enclose a lead 23 and the sleeve 34 for creating the loosening prevention kinks 33 is caulked by using a caulking tool 36 in order to form the loosening prevention kinks 33. In this way, the loosening prevention kinks 33 can be created and fixed at the same time on the lead 23. As a result, the loosening prevention kinks 33 can be created on the lead very easily.

Accordingly, it is possible to produce, without excessively increasing the manufacturing cost, a remote-controlled light receiving module 32 equipped with leads 23 each having loosening prevention kinks 33 which allow the remote-controlled light receiving module 32 to be positioned easily without causing any loosening during installation in the remote-controlled light receiving module 32 on a board 25. It should be noted that the subsequent processes of manufacturing the remote-controlled light receiving module 32 are the same as those in the conventional one. That is to say, the manufacturing is carried forward in the following order: chip bonding of the IC chips, wire bonding, resin sealing and separation of remote-controlled light receiving modules 32 from each other by cutting off unnecessary portions of the lead frame.

Figure 6:
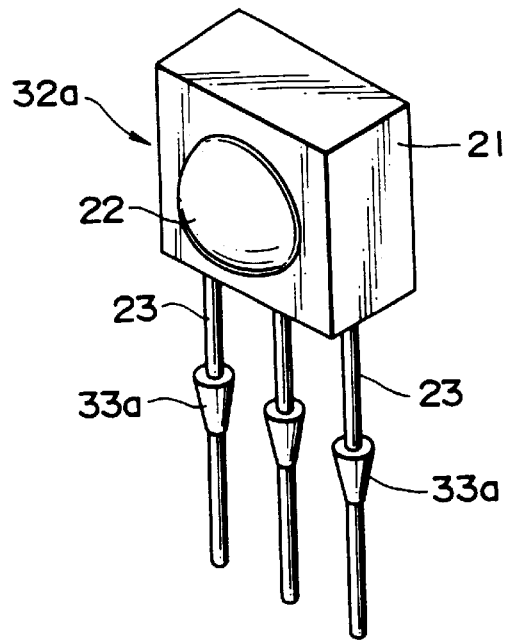
FIG. 6 is a perspective view showing a third embodiment implementing a remote-controlled light receiving module in accordance with the present invention.

FIG. 6 is a perspective view showing a third embodiment implementing a remote-controlled light receiving module in accordance with the present invention.

As shown in FIG. 6, a remote-controlled light receiving module 32a has leads 23 which each have a conical loosening prevention kink 33a created thereon. The present invention can also be applied to such a design as well.

Figure 7A:
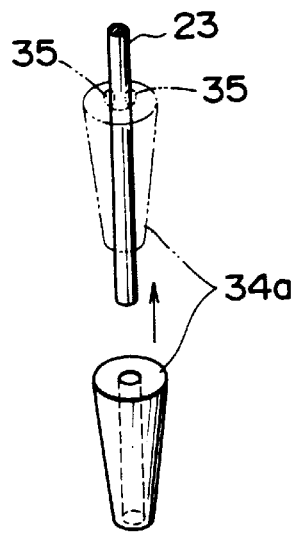
Figure 7B:
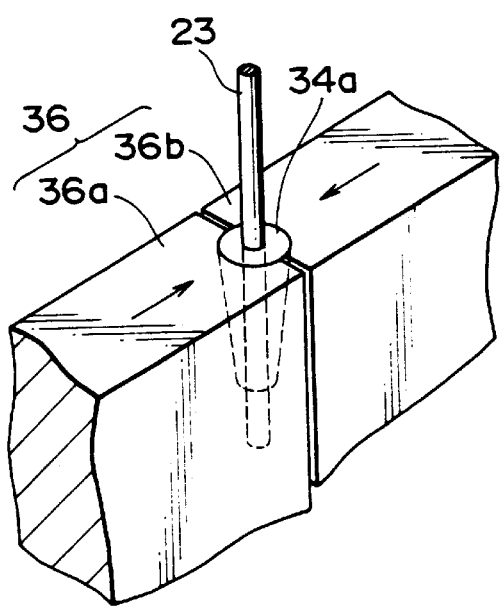

Such a conical loosening prevention kink 33a is also formed by using a sleeve 34a for creating a loosening prevention kink. FIGS. 7A and 7B are perspective views showing a fourth embodiment implementing an operation sequence of a method for creating a conical loosening prevention kink 33a in accordance with the present invention.

First of all, a lead frame comprising a plurality of leads 23 for the remote-controlled light receiving module 32a, which leads 23 are created as a bunch thereon, is prepared. As shown in FIG. 7A, a lead 23 from the lead frame on which a loosening prevention kink 33a is to be created is enclosed by a sleeve 34a for creating the loosening prevention kink 33a at a location where the loosening prevention kink 33a is to be positioned. In other words, the lead 23 is inserted into the sleeve 34a for creating the loosening prevention kink 33a. It should be noted that the number of leads 23 in a lead frame on which loosening prevention kinks are to be created varies, depending upon the application. In some cases, loosening prevention kinks 33a are to be created only on some leads 33a of a lead frame, while in other cases, all the leads 23 each need a loosening prevention kink 33a.

It should be noted that, also in the case of this electric member, the lead frame is equipped with two stoppers 35 caulked on each lead 23 thereof as indicated by dotted circles in FIG. 7A. The lead 23 is enclosed in the sleeve 34a for creating a loosening prevention kink 33a and it is needless to say that the sleeve 34a can be positioned correctly by shifting the sleeve 34a up to a location at which the stoppers 35 are attached to the lead 23.

Next, a caulking tool 36 is positioned in close proximity to the sleeve 34a for creating a loosening prevention kink 33a, which sleeve 34a has already enclosed the lead 23. The caulking tool 36 comprises a pair of caulking units 36a and 36b on both sides of the sleeve 34a separated from each other by an angle of 180 degrees as seen from the center of the caulking tool 36. Sandwiching the sleeve 34a, the caulking units 36a and 36b can move centrifugally away from the sleeve 34a or centripetally toward the sleeve 34a simultaneously in synchronization with each other. The edges of the caulking units 36a and 36b each have a concave surface approximately matching about half the outer surface of the conical loosening prevention kink 33a.

Next, the caulking tool 36 is actuated to carry out a caulking operation as shown in FIG. 7B. To be more specific, the caulking units 36a and 36b are driven to press the sleeve 34a from both sides, caulking the sleeve 34a for creating a loosening prevention kink 33a on the lead 23. In this way, the loosening prevention kink 33a is created and, at the same time, fixed on the lead 23.

Later on, the caulking tool 36 is operated to move centrifugally, releasing the lead 23.

According to the above method of creating a loosening prevention kink 33a, a sleeve 34a for creating the loosening prevention kink 33a prepared in advance is merely positioned to enclose a lead 23 and the sleeve 34a for creating the loosening prevention kink 33a is caulked by using the caulking tool 36 in order to form the loosening prevention kink 33a. In this way, the loosening prevention kink 33a can be created and fixed at the same time on the lead 23. As a result, the loosening prevention kink 33a can be created on the lead very easily. Accordingly, it is possible to produce, without excessively increasing the manufacturing cost, a remote-controlled light receiving module 32 equipped with leads 23 each having a loosening prevention kink 33a which allows the remote-controlled light receiving module 32 to be positioned easily without causing any loosening in the installation of the remote-controlled light receiving module 32 on a printed wiring board 25.

Figure 8A:
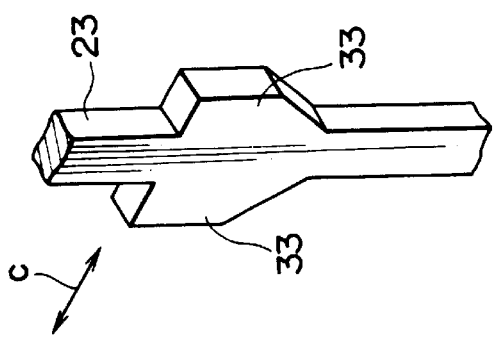
FIGS. 8A to 8C show a fifth embodiment implementing a remote-controlled light receiving module in accordance with the present invention.
Figure 8B:
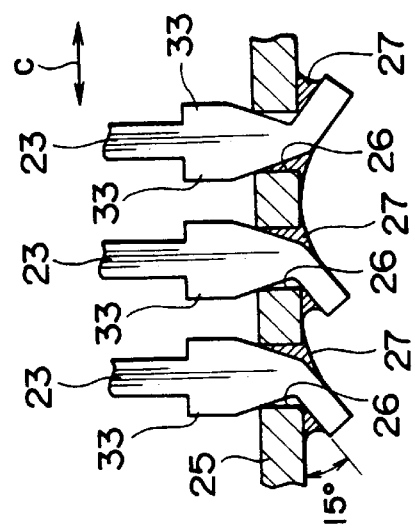
Figure 8C:
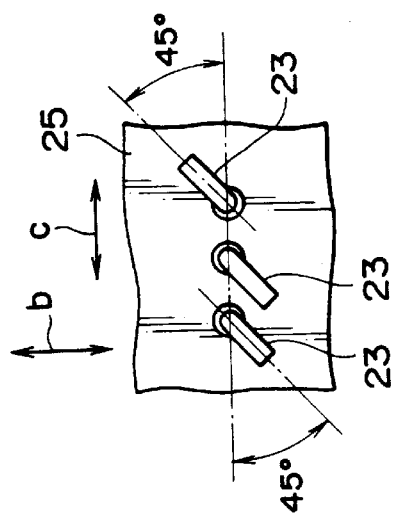

Main elements of a fifth embodiment provided by the present invention are shown in FIGS. 8A to 8C. FIG. 8A is a perspective view showing a kink whereas FIG. 8B is a sectional view showing a post-mounting state. FIG. 8C is a diagram showing a bottom surface in the post-mounting state.

In the case of this embodiment, each of the leads 23 has two loosening prevention kinks 33 forming an angle of 180 degrees with each other. That is to say, the loosening prevention kinks 33 form a dash as viewed from a position above them.

Much like the manufacturing of a lead frame, the leads 33 each having such loosening prevention kinks 33 can be created very easily by pressing a planar lead material or by using a technique of manufacture adopting the etching method. That is to say, an operation for creating each loosening prevention kink is not specially required in manufacturing the leads.

In such an embodiment, each loosening prevention kink 33 extends from the surface of the planar lead material cited above. Accordingly, by inserting the lead 23 into the lead inserting through hole 26 and sticking or pressing the loosening prevention kinks 33 thereof to or against the lead inserting through hole 26, the position of the lead 23 is fixed naturally in a direction indicated by an arrow C.

Then, portions of the leads 23 protruding downward from the printed wiring board 25 are cut to a proper length and bent at the back surface of the printed wiring board 25 at an appropriate angle. In this way, positioning in a direction indicated by an arrow b perpendicular to the direction indicated by the arrow c, that is, the optical axis direction can also be fixed.

Speaking in concrete terms, the lead 23 is bent to form typically an angle of 15 degrees with the back surface of the printed wiring board 25. The bent portion of the lead 23 forms a typical angle of 45 degrees with the direction indicated by the arrow c on the back surface of the printed wiring board 25. The lead 23 is bent in the exactly opposite direction to that of the other lead 23.

In this way, there is no loosening in any direction such as the direction indicated by the arrow b, that is, the optical axis direction and the direction indicated by arrow c, that is a direction perpendicular to the optical axis direction shown in FIG. 8.

It should be noted that the lead 23 can also be bent to form an angle of 90 degrees with the direction indicated by the arrow c on the back surface of the printed wiring board 25 instead of the bending angle described above. As for the bending direction of a lead 23 relative to other leads 23, it is needless to say that, in this case, a portion of a lead 23 can also be bent in a direction opposite to that of the other leads 23.

In the case of such a remote-controlled light receiving module, loosening prevention kinks 33 can be created by manufacture to press a lead material with ease. Such a remote-controlled light receiving module offers an advantage that the loosening prevention kinks can be created more easily than those shown in FIGS. 3A to 3D and 6.

In the embodiment described above, the number of leads 23 is 3 and they each have loosening prevention kinks 33 or 33a created thereon. It should be noted, however, that loosening prevention kinks 33 or 33a can be created only on the two leads 23 at the ends of the remote-controlled light receiving module.

In addition, the present invention can also be applied to a remote-controlled receiver module having a lead count other than three as well. In this case, it is not necessary to create loosening prevention kinks 33 or 33a on all the leads 33. It is needless to say that loosening prevention kinks 33 or 33a can be created only on two leads 23 attached typically at the ends of the remote-controlled light receiving module.

The electric member having a plurality of leads provided by the present invention can also be applied to an optical apparatus employing a light receiving device as an optical device such as a remote-controlled light receiving module, or employing a light emitting device as an optical device. That is to say, the present invention can be applied not only to a light receiving apparatus such as a remote-controlled receiver module, but also to a light emitting apparatus that employs, for example, a surface light emitting diode as an optical device for emitting light generated therefrom to the outside world through a lens.

On top of that, the present invention can also be applied to any electric member other than an optical device as long as the electric member has a plurality of leads.

In the case of the electric member having a plurality of leads provided by the present invention, on each of the leads loosening prevention kinks are created, and the closer the distance from the loosening prevention kinks to the tip of the lead, the thinner the loosening prevention kinks are, such that the orientation of the leads relative to the mounting board is fixed when the leads are inserted into the lead inserting through holes on the mounting board by pressure. In this way, loosening of the leads can be prevented.

In addition, the position at which the loosening prevention kinks are created on each of the leads determines the height of the electric member itself above the mounting board. As a result, the position and the orientation of the electric member can be fixed without using a socket.

In this way, the problems of fixing the position and orientation of the conventional remote-controlled light receiving module, for example, caused by the use of a socket can therefore be solved. Since a socket is not required, it is needless to say that the number of components and, thus, the number of assembly operations can be reduced. In the soldering process, the solder which was once molten heat shrinks as the solder temperature goes down, generating a shrinking force that pulls the leads in a downward direction. However, the loosening prevention kinks deeply rooted into the lead inserting through holes function as stoppers so that the shrinking force pulling down the leads is not applied to the portion of the lead above the loosening prevention kinks. As a result, there is no longer a problem that an IC pellet enclosed in the package experiences the shrinkage force as is the case with the conventional remote-controlled light receiving module. It should be noted that the IC pellet itself is not shown in the figure.

The present invention also provides a method for manufacturing the electrical member wherein each of the leads thereof is enclosed in a sleeve for creating loosening prevention kinks prepared in advance and, with the lead enclosed in the sleeve for creating the loosening prevention kinks, the loosening prevention kinks can thus be created by merely caulking the sleeve and, at the same time, securing the sleeve to the lead, allowing the loosening prevention kinks to be formed on the lead very easily.

As a result, an electric member equipped with a plurality of leads each having loosening prevention kinks can be produced without excessively increasing the manufacturing cost wherein the loosening prevention kinks allow the position of the electric member to be fixed with ease, preventing loosening of the leads from occuring when the electric member is mounted on a printed wiring board.

The present invention further provides a method for manufacturing the electric member wherein each of the leads thereof and the loosening prevention kinks are created at the same time by manufacturing a planar lead material, requiring no special process used only for creating the loosening prevention kinks. As a result, each of the leads along with the loosening prevention kinks thereof can be created very easily without increasing the number of operations.

What is claimed is:

1. A method for manufacturing a loosening prevention kink for an electric member having a plurality of leads each with a corresponding major axis, wherein at least one of said plurality of leads includes said loosening prevention kink used to fixedly set an orientation of said electric member relative to a mounting board when said electric member is mounted on said mounting board by inserting said plurality of leads into lead inserting through-holes in said mounting board, and wherein said method for manufacturing said loosening prevention kink comprises the steps of:

enclosing said one of said plurality of leads in a sleeve at a predetermined location on said one of said plurality of leads, wherein said sleeve has a frusto-conical shape such that as a distance from a point along said major axis to a tip of said one of said plurality of leads decreases a cross-sectional area of said loosening prevention kink decreases; and securely attaching and forming said loosening prevention kink by caulking said sleeve using a caulking tool including four caulking units, each of said caulking units being positioned symmetrically to form a 90° angle with adjacent caulking units and each having two surfaces, each of said two surfaces being parallel to a corresponding surface of said adjacent caulking units and said two surfaces intersecting to form a line Parallel to said major axis.

2. The method for manufacturing a loosening prevention kink for an electric member according to claim 1, further comprising the step of moving said four caulking units of said caulking tool toward said major axis in order to caulk said sleeve and form said loosening prevention kink.

3. The method for manufacturing a loosening prevention kink for an electric member according to claim 2, wherein said loosening prevention kink is formed by moving said four caulking units toward said major axis simultaneously.

* * * * *